(12) United States Patent
Hedrick et al.

(10) Patent No.: US 7,081,673 B2
(45) Date of Patent: Jul. 25, 2006

(54) MULTILAYERED CAP BARRIER IN MICROELECTRONIC INTERCONNECT STRUCTURES

(75) Inventors: Jeffrey C. Hedrick, Montvale, NJ (US); Elbert E. Huang, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 10/648,884

(22) Filed: Aug. 27, 2003

(65) Prior Publication Data
US 2004/0207084 A1    Oct. 21, 2004

Related U.S. Application Data

(60) Provisional application No. 60/463,758, filed on Apr. 17, 2003.

(51) Int. Cl.
H01L 23/48 (2006.01)
(52) U.S. Cl. ..................................................... 257/751
(58) Field of Classification Search ................ None
See application file for complete search history.

(56) References Cited

U.S. PATENT DOCUMENTS

| 6,265,779 | B1 | 7/2001 | Grill et al. |
| 6,917,108 | B1* | 7/2005 | Fitzsimmons et al. ...... 257/751 |
| 2002/0130417 | A1 | 9/2002 | Yew et al. |
| 2003/0089988 | A1 | 5/2003 | Matsuura |

* cited by examiner

*Primary Examiner*—Leonardo Andujar
(74) *Attorney, Agent, or Firm*—Scully, Scott, Murphy & Presser, P.C.; Daniel P. Morris, Esq.

(57) ABSTRACT

Structures having low-k multilayered dielectric diffusion barrier layer having at least one low-k sublayer and at least one air barrier sublayer are described herein. The multilayered dielectric diffusion barrier layer are diffusion barriers to metal and barriers to air permeation. Methods and compositions relating to the generation of the structures are also described. The advantages of utilizing these low-k multilayered dielectric diffusion barrier layer is a gain in chip performance through a reduction in capacitance between conducting metal features and an increase in reliability as the multilayered dielectric diffusion barrier layer are impermeable to air and prevent metal diffusion.

22 Claims, 3 Drawing Sheets

MULTILAYERED CAP BARRIER IN MICROELECTRONIC INTERCONNECT STRUCTURES

RELATED APPLICATIONS

This application claims benefit of U.S. Provisional Application Ser. No. 60/463,758, filed Apr. 17, 2003.

BACKGROUND OF THE INVENTION

1. Field of the Invention

The present invention relates to the utilization of a multilayered cap barrier layer that has a low composite dielectric constant (k<4.0) and has barrier properties to metal diffusion and air permeation. More particularly, the present invention relates to the use of the multilayered cap barrier layer in metal interconnect structures that are part of integrated circuits and microelectronic devices. The primary advantage that is provided by the present invention is the reduction in the capacitance between conducting metal features, e.g., copper lines, that results in an enhancement in overall chip performance. Methods for the utilization, compositions of matter, and structures that implement the barrier films are also described.

2. Background Art

The utilization of materials that serve as diffusion barriers to metal in metal interconnect structures, that are part of integrated circuits and microelectronic devices, is typically required to generate reliable devices as low-k interlayer dielectrics do not prohibit metal diffusion. The placement of these materials in the interconnect structure can differ and will be dependent upon their qualities and the means in which they are deposited and processed. Both barrier layers comprised of metal and dielectrics are commonly utilized in interconnect structures.

Diffusion barrier layers, comprised of metal and metal containing materials including, for example, tantalum, tungsten, ruthenium, tantalum nitride, titanium nitride, TiSiN, etc., often serve as liners whereby they form a conformal interface with metal conducting structures. Normally, these materials are deposited by chemical vapor deposition (CVD), plasma-enhanced chemical vapor deposition (PECVD), atomic layer deposition, (ALD), sputtering, thermal evaporation, and other related approaches. To utilize these materials as barrier layers, the metal barrier layers must be conformal to conducting metal lines and cannot be placed as blanket layers that would serve as conducting pathways between metal lines. One limiting criteria for these barrier layers is that their contribution to the resistivity of conducting metal lines must not be excessively high; otherwise, the increase in the total resistance of the metal conducting structures would result in reduced performance.

Diffusion barrier layers comprised of dielectrics including, for example, silicon nitrides, silicon carbides, and silicon carbonitrides, are also utilized in microelectronic devices. These materials are normally deposited by chemical vapor deposition (CVD) and plasma-enhanced chemical vapor deposition (PECVD) approaches and can be deposited as continuous films, e.g., as cap barrier layers. Unlike diffusion barrier layers comprised of metal, the dielectric layers can be deposited as blanket films and can be placed between conducting metal lines. In doing so, these dielectric layers contribute to the capacitance between metal lines. A limiting constraint of these systems is their relatively high dielectric constants (k=4.5–7) that result in a substantial increase in the effective dielectric constant between metal lines and leads to reduced device performance. Decreasing the film thickness of these barrier layers can lead to reductions in the effective dielectric constant; however, insufficiently thick layers may not be reliable and nevertheless may have significant contributions to the effective dielectric constant.

Barrier layer films that are generated by spin-coating, or other solvent based approaches, that prohibit copper diffusion have also been proposed. These systems can be polymers that may be cured at elevated temperatures to produce rigid, crosslinked systems that are thermally stable to temperatures in excess of 400° C. A primary advantage of many of these systems is the low dielectric constant that these materials exhibit; dielectric constants of 2.6 have been measured. Examples of such systems include: polysilazanes, polycarbosilanes, polysilsesquiazanes, polycarbosilazanes, etc.

In addition to copper diffusion barrier properties, barrier properties to air permeation is highly desirable for barrier layer films. Air permeation through barrier layer films can adversely lead to oxidation of conducting metal features and result in reduced reliability and/or performance. Some dielectric copper diffusion barriers deposited by CVD and related approaches have been observed to display air barrier properties due to their high density. However, many of the low-k copper diffusion barriers applied by solvent based approaches do not serve as a barrier to air permeation due to their relatively open structure which may contain a significant portion of voids or free volume.

SUMMARY OF THE INVENTION

The present invention relates to interconnect structures including a multilayered dielectric diffusion barrier layer having a low dielectric constant (k<4.0) and which serves as a barrier to metal diffusion and air permeation. The multilayered dielectric diffusion barrier layer of the present invention is comprised of sublayers where at least one air barrier sublayer is a dielectric deposited by CVD or a related process and at least one low-k sublayer is a barrier dielectric deposited by a solvent based approach. The advantage of utilizing both types of dielectrics is that the multilayered dielectric diffusion barrier layer will exhibit a composite dielectric constant that is significantly lower than CVD deposited barrier dielectrics while maintaining barrier properties to air permeation which may not be afforded by low-k solvent deposited barrier dielectrics alone.

The present invention can be employed in any microelectronic device that utilizes metal interconnect structures including, for example, high speed microprocessors, application specific integrated circuits (ASICs), and memory storage. The utilization of the multilayered dielectric diffusion barrier layer of the present invention is extremely advantageous in comparison to prior art approaches, as it results in microelectronic devices with increased performance through a reduction in the capacitance between conducting metal lines while maintaining properties conducive to generating reliable structures.

The inventive structure may be comprised of at least one conducting metal feature, formed on a substrate, with the substrate further comprising at least one insulating layer surrounding the conducting metal feature. The insulating layer may surround the at least one conducting metal feature at its bottom, top, and lateral surfaces. The inventive structure may further comprise at least one conductive barrier layer disposed at least at one interface between the insulating layer and the at least one conducting metal feature. The combination of the at least one conducting metal feature and the insulating layers, may be repeated to form a multilevel interconnect stack.

The structure may be one of a silicon wafer containing microelectronic devices, a ceramic chip carrier, an organic chip carrier, a glass substrate, a gallium arsenide wafer, a silicon carbide wafer, a gallium wafer, or other semiconductor wafer.

The substrate may be a silicon wafer containing electronic devices. The substrate consists in part, or in entirety, of Si, $SiO_2$, SiGe, Ge, Ga, GaAs, Hg, HgTd, InP, In, Al, or any other semiconducting material that is inorganic or organic in nature.

In a first embodiment of the present invention, an interconnect structure including the multilayered dielectric diffusion barrier layer comprised of two or more dielectric sublayers that exhibit metal diffusion barrier properties is described. At least one of these sublayers is an air barrier sublayer that may be a CVD deposited dielectric that is impermeable to air diffusion. At least another of these sublayers is a low-k sublayer that is applied by any solvent based approach (e.g., spin-coating) and has a dielectric constant less than 3.0. The low-k sublayer may be placed atop and/or below the air barrier sublayer. Optionally, adhesion promoters may be applied at any of the interfaces in the multilayered dielectric diffusion barrier layer or at interfaces between the sublayers.

In a first example of the first embodiment, the multilayered dielectric diffusion barrier layer is utilized as a cap barrier layer. The remaining dielectrics in the interconnect structure may be comprised of a via level dielectric, a line level dielectric (which may be identical in composition to the via level dielectric), optional hardmask layers, and optional buried etch stop layers.

In a second example of the first embodiment, a multilayered dielectric diffusion barrier layer is utilized simultaneously as a cap barrier layer and a via level dielectric. The remaining dielectrics in the interconnect structure may be comprised of a line level dielectric, optional hardmask layers, and optional buried etch stop layers.

In a third example of the first embodiment, a multilayered dielectric diffusion barrier layer is utilized as a cap barrier layer and is atop an interconnect structure having an interlayer dielectric comprised of at least two dielectrics where the via level dielectric, which is underneath metal lines, chemically differs from the dielectrics in other regions.

The multilayered dielectric diffusion barrier layer of the present invention has a composite dielectric constant of less than 4.0, prohibits metal diffusion, serves as a barrier to air permeation, and is thermally stable to temperatures greater than 400° C. The multilayered dielectric diffusion barrier layer of the present invention may also contain porosity that further reduces the dielectric constant. The pores may be generated by a removal of a sacrificial moiety that may be polymeric. The pores may also be generated by a process that involves an elimination of a high boiling point solvent. The pores may have a size scale of 0.5–20 nanometers and may have a closed cell morphology.

In a second embodiment of the present invention, a method to produce the multilayered dielectric diffusion barrier layer is described. The multilayered dielectric diffusion barrier layer of the present invention is generated atop an interconnect structure having exposed metal and dielectric features. Each sublayer is then deposited by either chemical vapor deposition (or related approaches) or by solvent based processes (e.g., spin coating). After each deposition step, the films may be annealed at elevated temperatures (100°–500° C.), exposed to electron beams, and/or irradiated with ultraviolet light, prior to the deposition of the subsequent sublayer. Optionally, adhesion promoters may be applied at any interface of the multilayered dielectric diffusion barrier layer or at interfaces between the sublayers.

In a third embodiment of the present invention, compositions of the multilayered dielectric diffusion barrier layer, its sublayers, and precursors used to generate these layers are described. At least one air barrier sublayer is produced by a chemical vapor deposition based process whereby the air barrier sublayer is comprised of silicon nitride, silicon carbonitride, or a dielectric having the general composition of $Si_vN_wC_xO_yH_z$ where $0.1 \leq v \leq 0.8$, $0 \leq w \leq 0.8$, $0.05 \leq x \leq 0.8$, $0 \leq y \leq 0.3$, $0.05 \leq z \leq 0.8$ for $v+w+x+y+z=1$. At least one other sublayer is deposited by a solvent based approach that utilizes a polymeric preceramic precursor dissolved in solution. Upon film formation, the polymeric preceramic precursor is converted to an insoluble low-k sublayer having the general composition of $Si_vN_wC_xO_yH_z$ where $0.1 \leq v \leq 0.8$, $0 \leq w \leq 0.8$, $0.05 \leq x \leq 0.08$, $0 \leq y \leq 0.3$, $0.05 \leq z \leq 0.8$ for $v+w+x+y+z=1$.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1:
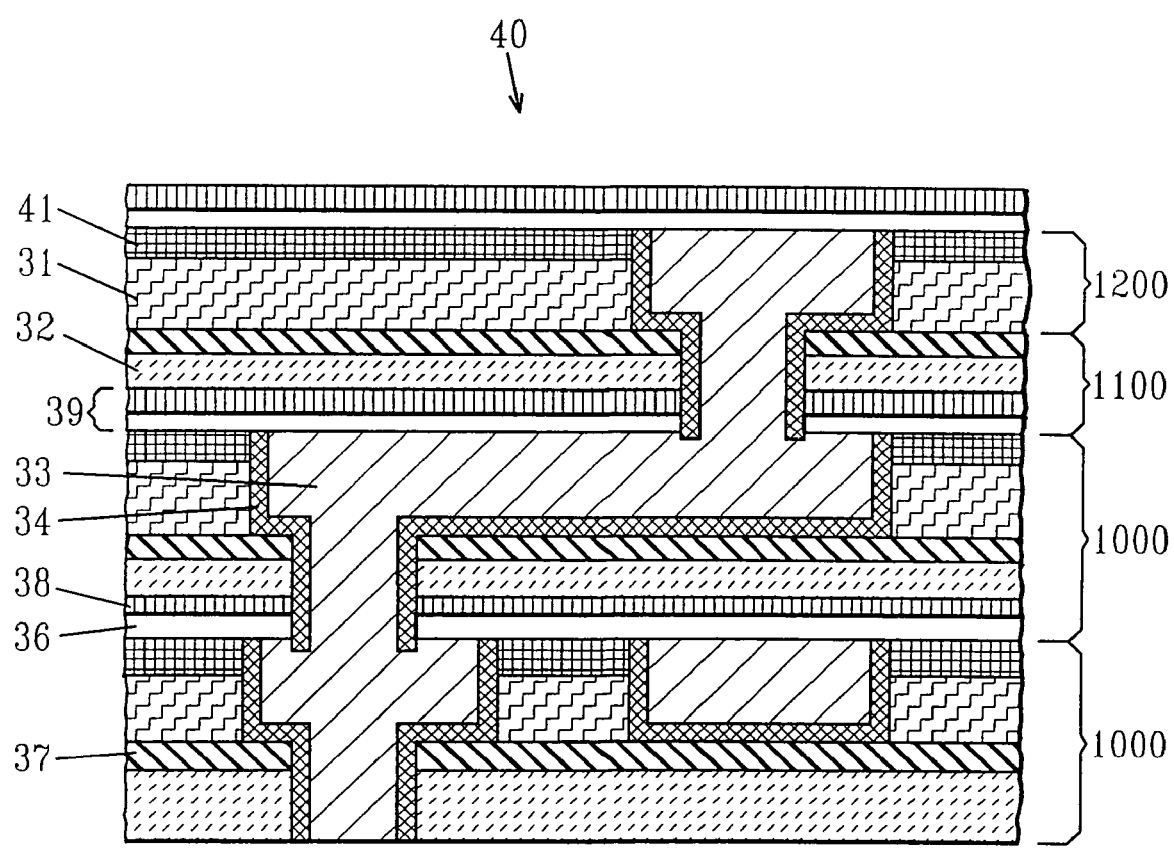
FIG. 1 is a cross sectional view of a semiconductor device in accordance with the present invention.

In accordance with the first embodiment of the present invention, an interconnect structure comprising at least one conductive metal feature, with the structure further comprising an interlayer dielectric layer comprised of a line level dielectric and a via level dielectric, surrounding conducting metal features whereby a multilayered dielectric diffusion barrier layer that is a barrier to metal diffusion and air permeation is described.

The inventive multilayered dielectric diffusion barrier layer has a composite dielectric constant less than 4.0, is thermally stable above temperatures of 300° C., has a thickness between 10 and 500 nm, and is comprised of at least two sublayers where at least one sublayer is an air barrier sublayer and at least another sublayer is a low-k sublayer. The multilayered dielectric diffusion barrier layer of the present invention may have a variety of configurations including, for example, a bilayer with the low-k sublayer atop the air barrier sublayer, a bilayer with the air barrier sublayer atop the low-k sublayer, or a trilayer with the air barrier sublayer placed between two low-k sublayers.

The air barrier sublayer is a dielectric that is impermeable to air, has a dielectric constant that is between 3.4–7.2, has a thickness between 5 and 100 nm, may be a barrier to metal diffusion, and is deposited by a vapor deposition based process including, for example, chemical vapor deposition, plasma enhanced chemical vapor deposition, physical vapor deposition, or any related process. It may be a dielectric that has a composition of $Si_vN_wC_xO_yH_z$ where $0.1 \leq v \leq 0.08$, $0 \leq w \leq 0.08$, $0.05 \leq x \leq 0.8$, $0 \leq y \leq 0.3$, $0.05 \leq z \leq 0.8$, and $v+w+x+y+z=1$. Examples of the air barrier sublayer including, for example, silicon nitride, silicon carbonitride, silicon oxynitride, silicon dioxide, silicon carbide, and fluorinated glass.

The low-k sublayer is a dielectric that has a dielectric constant less than 3.3, is a barrier to metal diffusion, has a thickness between 5 and 500 nm, and is generated by a solvent based approach including, but not limited to: spin coating, spray coating, scan coating, and dip coating. The low-k sublayer may be a dielectric comprised of $Si_vN_wC_xO_yH_z$ where $0.1 \leq v \leq 0.08$, $0 \leq w \leq 0.08$, $0.05 \leq x \leq 0.8$, $0 \leq y \leq 0.3$, $0.05 \leq z \leq 0.8$, and $v+w+x+y+z=1$. The low-k sublayer may contain porosity where the porosity may have a size scale of 0.5–20 nm and may have closed cell morphology.

The interconnect structure of the present invention is further comprised of at least one low dielectric constant material. The low dielectric constant material may be any dielectric known in the art including, for example, spin-on systems such as: polysiloxanes, polysilsesquioxanes, polyarylenes, poly(arylene ethers), or dielectric films that are generated by vapor deposition approaches which may have a composition $Si_vN_wC_xO_yH_z$ where $0.05 \leq v \leq 0.8$, $0 \leq w \leq 0.09$, $0.05 \leq x \leq 0.8$, $0 \leq y 0.8$, $0.05 \leq z \leq 0.8$ for $v+w+x+y+z=1$. Furthermore, the inventive low dielectric constant material may be porous. Finally, the low dielectric constant material may be air or an inert gas.

In addition, the interconnect structure of the present invention is further comprised of conducting metal features which may be comprised of copper, silver, gold, aluminum and alloys thereof. The conducting metal lines may have a metal at the top surface that reduces the electromigration characteristics of the interconnect structure that may be comprised of a composition including: cobalt, tungsten, phosphorous, and combinations thereof. The conducting metal lines may have a moiety at the top surface that reduces the propensity of the metal lines to oxidize. Examples of such moieties include: benzotriazoles, amines, amides, imides, thioesters, thioethers, ureas, urethanes, nitriles, isocyanates, thiols, sulfones, phosphines, phosphine oxides, phosphonimides, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, and indolines.

Furthermore, the inventive interconnect structure is further comprised of a lining metal containing barrier layers that are used to prevent metal diffusion. The lining metal containing barrier layers may be comprised of: tantalum, tantalum nitride, tungsten, titanium, titanium nitride, ruthenium, TiSiN, and combinations thereof.

Finally, optional hardmask dielectric and dielectric etch stop layers may be present in the inventive structure. Illustrative examples as such dielectric materials include polysiloxanes, polysilsesquioxanes, or any CVD deposited dielectric having the composition $Si_vN_wC_xO_yH_z$ where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

Referring to FIG. 1, in the first embodiment, an example of an interconnect structure 40, comprised of multiple levels 1000 where each level may consist of a via level 1100 and line level 1200, is shown. The interconnect structure contains conducting metal features 33 that traverse through the structure and may have interfaces with a lining metal containing barrier 34. The conducting metal features and lining metal containing barrier are surrounded by dielectrics. The dielectrics in the via level include a low dielectric constant material 32 and the inventive multilayered dielectric diffusion barrier layer 39 that is comprised of at least two sublayers—the air barrier sublayer 36 and the low-k sublayer 38. The dielectrics in the line level 1200 include a low dielectric constant material 31 and an optional hardmask dielectric 41. Optionally, a dielectric etch stop layer 37 may be placed between the low dielectric constant materials in the via level and line level (32 & 31). The low dielectric constant material in the via level and line level (32 & 31, respectively) may be identical in composition or may chemically differ.

Figure 2:
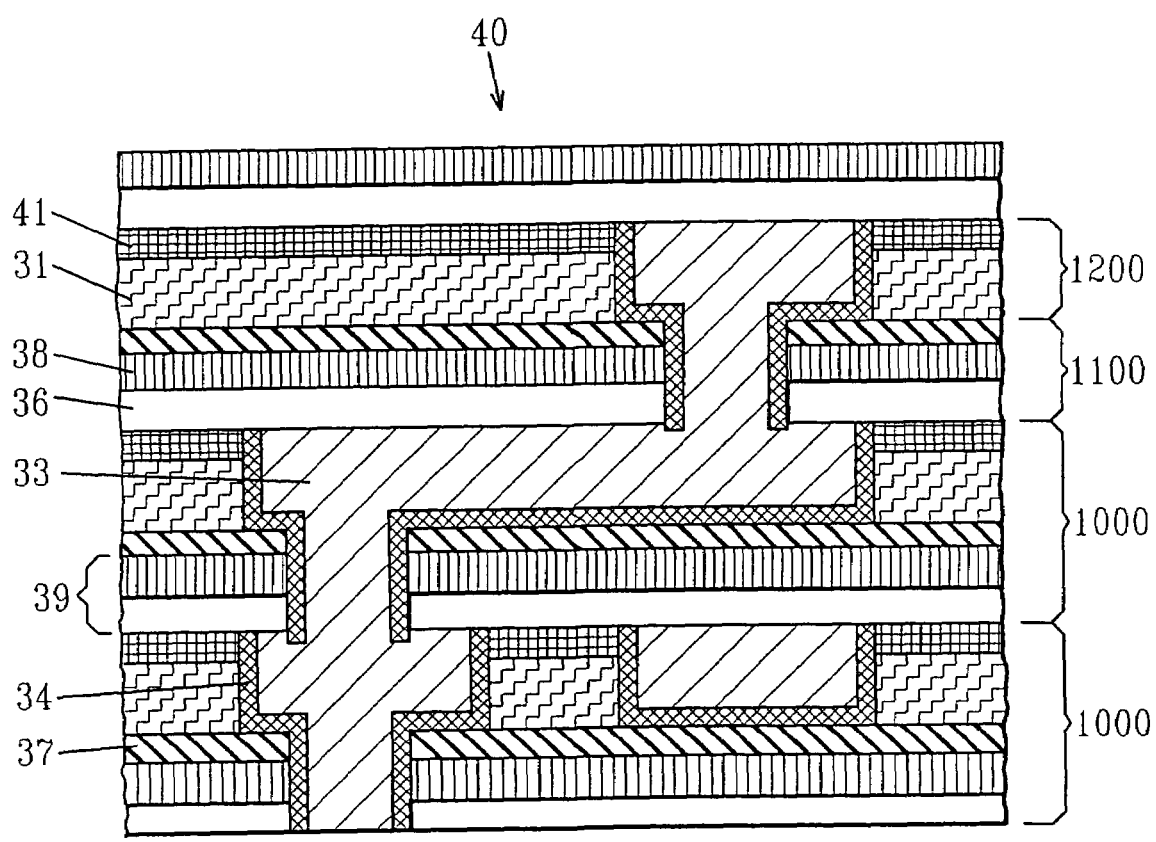
FIG. 2 is a cross sectional view of another semiconductor device in accordance with the present invention.

Referring to FIG. 2, in the first embodiment, an example of another interconnect structure 40, comprised of multiple levels 1000 where each level may consist of a via level 1100 and line level 1200, is shown. The interconnect structure contains conducting metal features 33 that traverse through the structure and may have interfaces with a lining metal containing barrier 34. The conducting metal features and lining metal containing barrier are surrounded by dielectrics. The dielectrics in the via level include the inventive multilayered dielectric diffusion barrier layer 39 that is comprised of at least two sublayers—the air barrier sublayer 36 and the low-k sublayer 38. The dielectrics in the line level include a low dielectric constant material 31 and an optional hardmask dielectric 41. Optionally, a dielectric etch stop layer 37 may be placed between the low dielectric constant materials in the line level 31 and the multilayered dielectric diffusion barrier layer 39.

Figure 3:
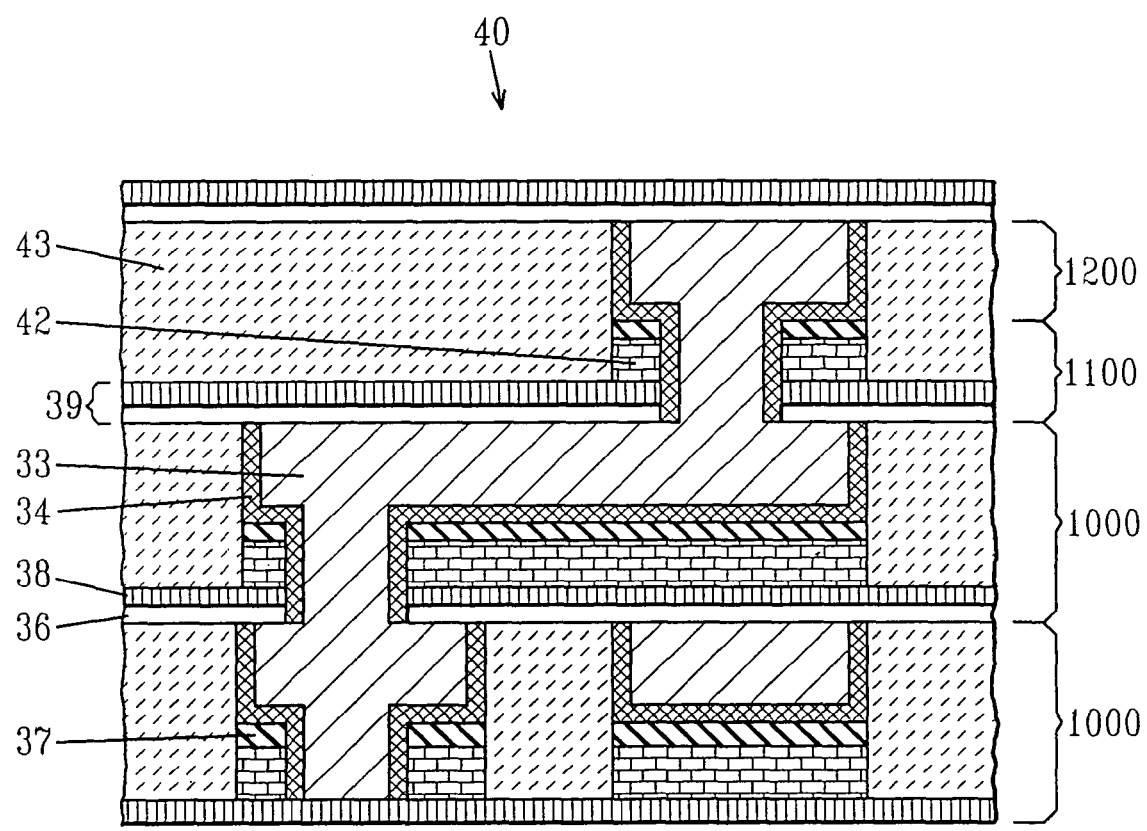
FIG. 3 is a cross sectional view of yet another semiconductor device in accordance with the present invention.

Referring to FIG. 3, in the first embodiment, another example of an interconnect structure 40, comprised of multiple levels 1000 where each level may consist of a via level 1100 and line level 1200, is shown. The interconnect structure contains conducting metal features 33 that traverse through the structure and may have interfaces with a lining metal containing barrier 34. The conducting metal features and lining metal containing barrier are surrounded by dielectrics. The dielectrics in the line level include a low dielectric constant material 43. The dielectrics in the via level include the identical low dielectric constant material 43 in regions not directly underlying conducting metal lines, a chemically different low dielectric constant material 42 which is present under conducting metal lines, and the inventive multilayered dielectric diffusion barrier layer. Optionally, a dielectric etch stop layer 37 may be placed between the low dielectric constant material 42 and the lining metal containing barrier 34 that is above it.

An adhesion promoter may be present between the multilayered dielectric diffusion barrier layer and dielectric layers above and/or below the multilayered dielectric diffusion barrier layer. Also, an adhesion promoter may be present between the sublayers of the multilayered dielectric diffusion barrier layer. The adhesion promoters may be selected from the group consisting of $Si_aL_bR_c$, wherein L is selected from the group consisting of hydroxy, methoxy, ethoxy, acetoxy, alkoxy, carboxy, amines, halogens, R is selected from the group consisting of hydride, methyl, ethyl, vinyl, and phenyl (any alkyl or aryl), a is from 0.25 to 0.5, b is from 0.1 to 0.8, c is from 0 to 0.7, and the sum of $a+b+c$ is 1. Examples of adhesion promoters that may be used in the present invention include: hexamethyldisilazane, vinyltriacetoxysilane, aminopropyltrimethoxysilane, and vinyl trimethoxysilane.

In accordance with the second embodiment of the present invention, a method of generating a multilayered dielectric diffusion barrier layer comprising: applying a coating of a polymeric preceramic precursor by a solvent based approach, converting the polymeric preceramic precursor into the low-k sublayer, and applying a coating of an air barrier sublayer is described.

The solvent based approach is used to deposit the polymeric preceramic precursor from solution to produce a film and can be performed by any process known in the art and may be one of: spin coating, spray coating, scan coating, or dip coating. The conversion of the polymeric preceramic precursor film into the low-k sublayer is through the use of one or a combination of any suitable processes including, for example, thermal curing, electron irradiation, ion irradiation, irradiation with ultraviolet and/or visible light. The thermal curing can be performed under inert atmospheres and/or at temperatures in excess of 400° C. Crosslinking mechanisms may occur during the conversion of the polymeric preceramic precursor into the low-k sublayer.

Methods used to generate porosity in the low-k sublayer may be utilized. Porosity may be formed by codissolving a sacrificial moiety in the solution containing the polymeric preceramic precursor. Upon conversion of the polymeric preceramic precursor into the low-k sublayer, the sacrificial moiety may be a polymeric material that degrades into low molecular weight byproducts and are expelled from the film. Alternatively, the porosity may be generated from an approach that utilizes a high boiling point solvent that is expelled from the film during the conversion of the polymeric preceramic precursor into the low-k sublayer.

The air barrier sublayer is applied by any vapor based deposition process known in the art including, for example, chemical vapor deposition, plasma enhanced chemical vapor deposition, and physical vapor deposition. The air barrier sublayer may be annealed through the use of one or a combination of any suitable processes including, for example, thermal curing, electron irradiation, ion irradiation, irradiation with ultraviolet and/or visible light. The thermal curing can be performed under inert atmospheres and/or at temperatures in excess of 400° C. Further densification of the air barrier sublayer may occur during the annealing process.

The annealing of the air barrier sublayer and the polymeric preceramic precursor into the low-k sublayer can be performed simultaneously. Furthermore, these annealing steps may coincide with the annealing process of other layers including the low dielectric constant material, hardmasks, and/or buried etch stops.

Numerous steps can be applied to enhance adhesion of the sublayers to the other sublayers and also to adjacent layers. One example is the aforementioned use of adhesion promoters. The adhesion promoter may be applied onto the substrate prior to or after the deposition of any sublayer. For the low-k sublayer, the adhesion promoter may be codissolved in the solution containing the polymeric preceramic precursor and may segregate to film interfaces either during application or during the conversion of the polymeric preceramic precursor into the low-k sublayer. Alternatively, the adhesion promoter may be applied to the film comprised of the polymeric preceramic precursor prior to the conversion of the polymeric preceramic precursor into the low-k sublayer. Finally, dry etch processes employing a reactive plasma may be applied to any of the sublayers, layers underlying any sublayers, and the film comprised of the polymeric preceramic precursor in order to modify the surface of the exposed film and enhance adhesion.

Methods used to clean or eliminate any chemicals remaining from other processes may also be applied to the substrate prior to the deposition of the multilayered dielectric diffusion barrier layer. This cleaning may involve exposing the substrate to acids, bases, and/or organic solvents. This cleaning may also involve dry etch processes.

In accordance with the third embodiment of the present invention, compositions for the generation of a multilayered dielectric diffusion barrier layer having a solvent for application of the low-k sublayer by the solvent based approach, a polymeric preceramic precursor that is converted to a low-k sublayer, and an air barrier sublayer is described.

The polymeric preceramic precursor may be a silicon containing system and may be comprised of the following: polysilazanes, polycarbosilanes, polysilasilazanes, polysilanes, polysilacarbosilanes, polysiloxazanes, polycarbosilazanes, polysilylcarbodiimides, polysilsesquiazanes, polysilsesquiazanes, and polysilacarbosilazanes. A highly preferred polymeric precursor is polyureamethyvinylsilazane (KiON). The polymeric preceramic precursor may contain some component of polysiloxanes or polysilsesquioxanes. The polymeric preceramic precursor may have pendant functional groups bonded to the chain backbone including, hydrido, vinyl, allyl, alkoxy, silyl, and alkyl groups. The polymeric preceramic precursor may have pendant functional groups bonded to the chain backbone that may have metal binding properties including: amines, amides, imides, thioesters, thioethers, ureas, urethanes, nitrides, isocyanates, thiols, sulfones, phosphines, phosphine oxides, phosphonimides, benzotriazoles, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, and indolines. The molecular weight of the polymeric preceramic precursor may be between 500 and 1,000,000 daltons. The polymeric preceramic precursor may be a homopolymer, random copolymer, block copolymer, or a polymer blend and can have any chain architecture including linear, networked, branched, and dendrimeric. The polymeric preceramic precursor may have a composition of $Si_vN_wC_xO_yH_z$ where $0.1 \leq v \leq 0.8$, $0 \leq w \leq 0.8$, $0.05 \leq x \leq 0.8$, $0 \leq y \leq 0.3$, $0.05 \leq z \leq 0.8$, and $v+w+x+y+z=1$.

The solvent based approach involves a solution of the polymeric preceramic precursor dissolved in an organic solvent. The organic solvent may be one or a combination of the following solvents: propylene glycol methyl ether acetate (PGMEA), propylene glycol methyl ether (PGME), toluene, xylene, anisole, mesitylene, butyrolactone, cyclohexanone, hexanone, ethyl lactate, and heptanone. The solution may contain an antistriation agent that is codissolved with the polymeric preceramic precursor to produce films of high uniformity. The amount of antistriation agent may be less than 1% of the solution containing the polymeric preceramic precursor. An adhesion promoter may also be co-dissolved in the solution containing the polymeric preceramic precursor. The adhesion promoter may be selected from the group consisting of $Si_aL_bR_c$ wherein L is selected from the group consisting of hydroxy, methoxy, ethoxy, acetoxy, alkoxy, carboxy, amines, halogens, R is selected from the group consisting of hydrido, methyl, ethyl, vinyl, and phenyl (any alkyl or aryl), a is from 0.25 to 0.5, b is from 0.1 to 0.8, c is from 0 to 0.7, and the sum of a+b+c is 1. The adhesion promoter may be: hexamethyldisilazane, vinyltriacetoxysilane, aminopropyltrimethoxysilane, vinyl trimethoxysilane, and combinations thereof. The adhesion promoter may be less than 2% of the solution containing the polymeric preceramic precursor.

A sacrificial moiety to produce porosity may be codissolved in the solution containing the polymeric preceramic precursor. The sacrificial moiety may be a sacrificial polymeric material that degrades into low molecular weight byproducts that are expelled from the film during the conversion of the polymeric preceramic precursor into the low-k sublayer. The sacrificial polymeric material may be one of, a combination of, or a copolymer of: poly(stryenes), poly(esters), poly(methacrylates), poly(acrylates) and poly(glycols), poly(amides), and poly(norbornenes). The sacrificial moiety may be a high boiling point solvent.

Upon conversion of the polymeric preceramic precursor into the low-k sublayer, the low-k sublayer may have a composition of $Si_vN_wC_xO_yH_z$ where $0.1 \leq v \leq 0.8$, $0 \leq w \leq 0.8$, $0.05 \leq x \leq 0.8$, $0 \leq y \leq 0.3$, $0.05 \leq z \leq 0.8$ for $v+w+x+y+z=1$. A more preferred composition for the low-k sublayer is $Si_vN_wC_xO_yH_z$ where $v=0.16\pm0.05$, $w=0.17\pm0.05$, $x=0.17\pm0.05$, $y=0$, $z=0.5\pm0.1$ for $v+w+x+y+z=1$.

The air barrier sublayer may have a composition of $Si_vN_wC_xO_yH_z$ where $0.1 \leq v \leq 0.08$, $0 \leq w \leq 0.8$, $0.05 \leq x \leq 0.08$, $0 \leq y \leq 0.3$, $0.05 \leq z \leq 0.8$ $v+w+x+y+z=1$. A preferred composition for the air barrier sublayer is $Si_vN_wC_xO_yH_z$ where $v=0.28\pm0.05$, $w=0.12\pm0.05$, $x=0.28\pm0.05$, $y=0$, $z=0.32\pm0.05$ for $v+w+x+y+z=1$. Another preferred composition for the air barrier sublayer is $Si_vN_wC_xO_yH_z$ where $v=0.28\pm0.05$, $w=0$, $x=0.32\pm0.05$, $y=0$, $z=0.4\pm0.10$ for $v+w+x+y+z=1$.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated, but fall within the scope of the appended claims.

What is claimed is:

1. An interconnect structure comprising
at least one conducting metal feature on a substrate, said substrate further comprising an interlayer dielectric layer surrounding said conducting metal feature, a multilayered dielectric diffusion barrier layer that is a barrier to metal diffusion and is comprised of at least two sublayers where at least one sublayer is an air barrier sublayer which prohibits air permeation and at least another sublayer is a low-k sublayer that is comprised of $Si_vN_wC_xO_yH_z$ where $0.1 \leq v \leq 0.8$, $0 \leq w \leq 0.8$, $0.05x \leq 0.8$, $0 \leq y \leq 0.3$, $0.05 \leq z \leq 0.8$, and $v+w+x+y+z=1$, and
an interlayer dielectric that is comprised of a line level dielectric and a via level dielectric.

2. The structure of claim 1, wherein the multilayered dielectric diffusion barrier layer has a composite dielectric constant less than 4.0.

3. The structure of claim 1, wherein the air barrier sublayer is a dielectric comprised of a silicon nitride, silicon carbonitride, silicon oxynitride, silicon dioxide, silicon carbide, or fluorinated glass.

4. The structure of claim 1, wherein the air barrier sublayer is a dielectric that has a composition of $Si_vN_wC_xO_yH_z$ where $0.1 \leq v \leq 0.8$, $0 \leq w \leq 0.8$, $0.05 \leq x \leq 0.8$, $0 \leq y \leq 0.3$, $0.05 \leq z \leq 0.8$, and $v+w+x+y+z=1$.

5. The structure of claim 1, wherein the low-k sublayer contains porosity.

6. The structure of claim 5, wherein the porosity has a closed cell morphology.

7. The structure of claim 1, wherein the multilayered dielectric diffusion barrier layer is a bilayer with the low-k sublayer atop the air barrier sublayer.

8. The structure of claim 1, wherein the multilayered dielectric diffusion barrier layer is a bilayer where the air barrier sublayer atop the low-k sublayer.

9. The structure of claim 1, wherein the multilayered dielectric diffusion barrier layer is a trilayer with the air barrier sublayer placed between two low-k sublayers.

10. The structure of claim 1, wherein the interconnect structure further comprises at least one low dielectric constant material, said low dielectric constant material is comprised of at least one of polysiloxanes, polysilsesquioxanes, polyarylenes, poly(arylene ethers), or a dielectric that is generated by a vapor deposition approach producing a film having the composition $Si_vN_wC_xO_yH_z$ where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

11. The structure of claim 10, wherein the low dielectric constant material is porous.

12. The structure of claim 1, wherein the via level dielectric is comprised of at least one low dielectric constant material and the multilayered dielectric diffusion barrier layer.

13. The structure of claim 1, wherein the via level dielectric is comprised solely of the multilayered dielectric diffusion barrier layer.

14. The structure of claim 1, wherein the interlayer dielectric is comprised of a line level dielectric of one composition and a via level dielectric having two distinct compositions where the dielectric directly under conducting metal features are of one composition and dielectrics not directly under conducting metal features have the identical composition to the line level dielectric.

15. The structure of claim 1, wherein the conducting metal lines comprise a metal at the top surface that reduces the electromigration characteristics of the interconnect structure.

16. The structure of claim 1, wherein the conducting metal lines comprise a moiety at the top surface that reduces the propensity of the metal lines to oxidize, said moiety is one of benzotriazoles, amines, amides, imides, thioesters, thioethers, ureas, urethanes, nitriles, isocyanates, thiols, sulfones, phosphines, phosphine oxides, phosphonimides, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, or indolines.

17. The structure of claim 1, wherein the line level dielectric comprises a hardmask dielectric that differs in composition from the line level dielectric.

18. The structure of claim 17, wherein the hardmask dielectric comprises a polysiloxane, polysilsesquioxane, or any CVD deposited dielectric having the composition $Si_vN_wC_xO_yH_z$ where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

19. The structure of claim 1, wherein the line level dielectric and via level dielectric is separated by a dielectric etch stop layer.

20. The structure of claim 19, wherein the dielectric etch stop layer comprises a polysiloxane, polysilsesquioxane, or any CVD deposited dielectric having a composition comprised of $Si_vN_wC_xO_yH_z$ where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

21. The structure of claim 1, wherein at least one adhesion promoter is present between the multilayered dielectric diffusion barrier layer and dielectric layers above and/or below the multilayered dielectric diffusion barrier layer.

22. The structure of claim 1, wherein at least one adhesion promoter is present between the sublayers of the multilayered dielectric diffusion barrier layer.

* * * * *